(12) United States Patent
Christoph

(10) Patent No.: US 8,879,747 B2
(45) Date of Patent: Nov. 4, 2014

(54) ADAPTIVE FILTERING SYSTEM

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 350 days.

(21) Appl. No.: 13/482,678

(22) Filed: May 29, 2012

(65) Prior Publication Data

US 2012/0308029 A1     Dec. 6, 2012

(30) Foreign Application Priority Data

May 30, 2011 (EP) .................................. 11168083

(51) Int. Cl.
*H03B 29/00* (2006.01)
*H03H 17/02* (2006.01)
*H03H 21/00* (2006.01)

(52) U.S. Cl.
CPC ... *H03H 17/0266* (2013.01); *H03H 2021/0041* (2013.01); *H03H 21/0012* (2013.01); *H03H 17/0229* (2013.01)
USPC .................... 381/71.14; 379/406.14; 708/322

(58) Field of Classification Search
USPC ............. 381/97, 98, 71.11–71.14, 94.2, 94.3, 381/82, 83, 92, 89, 61, 63, 317, 318, 320; 379/406.08–406.14; 333/139, 175, 333/176; 700/94; 704/500, 502, 503; 375/350, 355; 708/300, 301, 309, 311, 708/312, 322, 323, 403, 404, 405
See application file for complete search history.

(56) References Cited

U.S. PATENT DOCUMENTS 5,566,167 A * 10/1996 Duttweiler .................... 370/290
5,721,772 A * 2/1998 Haneda et al. ........... 379/406.14
6,480,610 B1 * 11/2002 Fang et al. .................... 381/321
6,771,772 B1 * 8/2004 Tanrikulu ................. 379/406.14
7,774,396 B2 * 8/2010 Dickson et al. ............... 708/322
8,150,065 B2 * 4/2012 Solbach et al. ................. 381/98
8,170,226 B2 * 5/2012 Prakash et al. .............. 381/71.1
2006/0056641 A1 * 3/2006 Nadjar et al. .................... 381/67

FOREIGN PATENT DOCUMENTS

EP     0 746 133 A2     12/1996     ............. H04M 9/08
EP     1 638 079 A2      3/2006     ........... G10K 11/178

OTHER PUBLICATIONS

European Search Report, dated Oct. 18, 2011, pp. 1-8, European Patent Application No. 11168083.1, European Patent Office, Germany.
Weiss, S. et al., Adaptive Equalisation in Oversampled Subbands, Jul. 23, 1998, pp. 1-2, IEE, Electronic Letters.

(Continued)

*Primary Examiner* — Kumar Patel
*Assistant Examiner* — Jason R Kurr
(74) *Attorney, Agent, or Firm* — Brooks Kushman P.C.

(57) ABSTRACT

An audio system with at least one audio channel may include a digital audio processor in which at least one digital filter is implemented for each channel. The digital filter of each channel may include: an analysis filter bank configured to receive a broad-band input audio signal and divide the input audio signal into a plurality of sub-bands, a sub-band filter for each sub-band, and a synthesis filter bank configured to receive the filtered sub-band signals and combine them for providing a broad-band output audio signal. A delay is associated with each sub-band signal, the delay of one of the sub-band signals being applied to the broad-band input audio signal upstream of the analysis filter bank and the residual delays being applied to the remaining sub-band signals downstream of the analysis filter bank.

20 Claims, 8 Drawing Sheets

(56) References Cited

OTHER PUBLICATIONS

Sugiyama, Akihiko et al., A New Adaptive Intersubband Tap-Assignment Algorithm for Subband Adaptive Filters, 1995, pp. 3051-3054, IEEE.

Crockett, Brett et al., Next Generation Automotive Research and Technologies, May 20-23, 2006, pp. 1-14, Audio Engineering Society, Convention Paper 6649, Presented at the 120th Convention, Paris, France.

Weiss, Stephan et al., Design and Efficient Implementation of Oversampled GDFT Filter Banks for Subband Adaptive Filtering, May 2000, pp. 1-7.

Weiss, S. et al., Fast Implementation of Oversampled Modulated Filter Banks, Aug. 17, 2000, pp. 1-2, vol. 36, No. 17, Electronics Letters.

Weiss et at., "On Adaptive Filtering in Oversampled Subbands", Shaker Verlag, Aachen 1998.

Blauert, "Spatial Hearing", MIT Press, 1983.

* cited by examiner

ADAPTIVE FILTERING SYSTEM

1. PRIORITY CLAIM

This application claims the benefit of priority from European Patent Application No. 11 168 083.1, filed May 30, 2011, which is incorporated by reference.

2. TECHNICAL FIELD

The present invention relates to an adaptive filtering system that performs sub-band signal processing in audio applications, and in particular to a set of sub-band filters, which provide a computationally efficient implementation of a desired target transfer function

3. RELATED ART

Filters such as IIR filters (infinite impulse response filters) and FIR filters (finite impulse response filters) may be used to process audio signals in an audio system. Such filters may be implemented as digital filters. Each filter may include filter coefficients that define a transfer function. When an audio signal is processed through a filter, the audio signal can be modified according to the transfer function of the filter.

SUMMARY

An audio system with at least one audio channel is disclosed. The audio system includes a digital audio processor in which at least one digital filter is implemented for each channel. The digital filter of each channel comprises: an analysis filter bank configured to receive a broad-band input audio signal and divide the input audio signal into a plurality of sub-bands thus providing sub-band signals having equal bandwidths, the spectra of the sub-band signals composing the spectrum of the input audio signal; a sub-band FIR filter for each sub-band, thus providing respectively filtered sub-band signals; and a synthesis filter bank configured to receive the filtered sub-band signals and to combine them for providing a broad-band output audio signal, wherein a delay is associated with each sub-band signal, the delay of one of the sub-band signals being applied to the broad-band input audio signal upstream of the analysis filter bank and the residual delays being applied to the remaining sub-band signals downstream of the analysis filter bank.

BRIEF DESCRIPTION OF THE DRAWINGS

The invention can be better understood referring to the following drawings and descriptions. In the figures like reference numerals designate corresponding parts. In the drawings.

DETAILED DESCRIPTION

Figure 1:
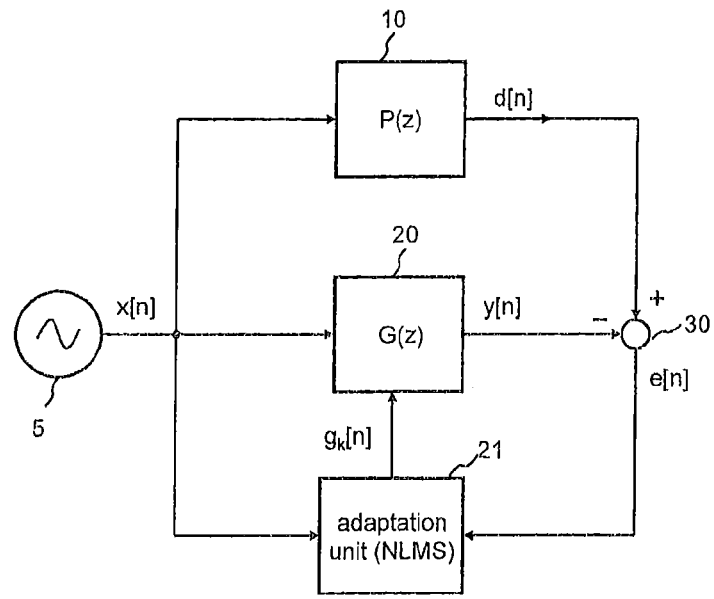
FIG. 1 illustrates an example adaptive signal processing module structure for an adaptive calculation of filter coefficients of a FIR filter.

In contrast to IIR filters (infinite impulse response filters) FIR filters (finite impulse response filters) provide for the possibility to realize digital filters having a desired transfer function (i.e. magnitude and phase response) which is arbitrarily definable. Thus, a desired transfer function can not only be designed to be minimum phase but also maximum or even mixed phase. Further, linear phase transfer functions can also be implemented, which is may be desired in audio signal processing In audio signal processing, the required filter lengths may be relatively long when using FIR filters, which can increase the computational effort as well as the memory requirements during operation of an audio system. This can be due to two physical factors. Firstly, the decay time of room impulse responses present in at least some audio applications is relatively long, which can result in correspondingly long filter lengths when using FIR filters. Secondly, the human auditory system is adapted to provide a non-uniform frequency resolution over different frequency bands. In general, the human auditory system resolves low frequencies quite well. Thus, frequency differences can be recognized relatively well at low absolute frequencies by the human auditory system, whereas high frequencies are not discerned so easily. For example, a 100 Hz tone may be easily distinguished from a 200 Hz tone, whereas the human ear has difficulties distinguishing a 5000 Hz tone from a 5100 Hz tone, although the frequency difference is 100 Hz in both cases. That is, the frequency resolution of the human auditory system generally decreases with increasing frequencies. This phenomenon is well known and forms the basis for psychoacoustical frequency scales adapted to the human auditory system such as the Bark scale, the Mel scale, and ERB (equivalent rectangular bandwidth) scale.

Research has shown that, as a result of the interior (carpets, upholstered furniture, etc.), the room impulse responses of listening rooms are considerably long, especially at low frequencies, because the degradation of energy is slow. This effect can be intensified by the fact that the sound pressure generated by an audio reproduction system is at a maximum in the bass frequency range (such as below 200 Hz) whereas the human auditory system is less sensitive to low frequency audio signals.

A consolidated view of all these factors indicates that the characteristics of the human auditory system, as well as the characteristics of typical listening rooms, may result in the lengths of FIR filters being no shorter than a certain minimum length in order to provide sufficient audio quality in audio signal processing systems. For example, to provide a required frequency resolution of about 10 Hz in the bass frequency range a FIR to filter with 4410 filter coefficients may be needed for each audio channel at a sampling frequency of 44100 Hz. In modern audio systems having a predetermined number of channels, such as up to 16 channels, 16 such FIR filters may be needed. Such long FIR filters may entail considerable computational effort and/or high memory requirements during operation, whereas an efficient implementation of FIR filters in audio applications having one or many channels may allow for the use of digital audio signal processing with significantly lower computational and memory requirements.

FIG. 1 illustrates an example adaptive signal processing module structure that may be used for adaptive calculation of filter coefficients of a FIR filter 20. The FIR filter 20 may represent a transfer function G(z) that approximately matches a predefined target function P(z) of a reference system 10. The adaptive signal processing module may be used for an adaptive calculation of filter coefficients $g_k$ (k=0, 1, . . . , K−1) of the FIR filter 20, whereby the subscript k denotes the index of the filter coefficient and K denotes the filter length. The FIR filter 20 may have a (discrete) transfer function G(z) which, after adaptation of the filter coefficients $g_k$, approximately matches the predefined target function P(z) of the reference system 10. In order to perform the adaptive filter design procedure the reference filter 10 and the FIR filter 20 may be supplied with a test signal (input signal x[n]) from a signal generator 5, which, for example, is white noise or any other signal having a bandwidth which includes the pass band of the target transfer function P(z). The output signal y[n] of the FIR filter 20 is subtracted (subtractor 30) from the output signal of the reference system 10, i.e. from the desired signal d[n]. The difference d[n]−y[n] is used as an error signal e[n] and supplied to an adaptation unit 21. The adaptation unit 21 is configured to calculate an updated set of FIR filter coefficients $g_k$ from the error signal and the input signal x[n] (also denoted as reference signal in this context) during each sample time interval. A Least-Mean-Square (LMS) algorithm or a Normalized-Least-Mean-Square (NLMS) algorithm may be employed, for example, for adaptation of the filter coefficients. However, other different adaptation algorithms may be utilized for this purpose, as well. After convergence of the adaptation algorithm, the FIR filter coefficients $g_k$ may represent a transfer function G(z) which is an optimum approximation of the target transfer function P(z). In other examples, an IIR filter may be used.

One option for reducing the computational effort when using FIR filters or IIR filters is to divide the spectrum of the signal to be filtered into a number of narrow band signals (sub-band signals) and to separately filter each narrow band signal. The division of a full-band signal into several sub-band signals may be implemented by means of an analysis filter bank (AFB). Similarly, the sub-band signals may be (re-) combined to a single full-band signal with a corresponding synthesis filter bank (SFB). In the following, a full-band signal is denoted without a subscript, e.g. the desired signal d[n], wherein n is the time index. Further, signals having a subscript, e.g. $d_m[n]$, denote a set of sub-band signals which are the decomposition of the corresponding full-band signal d[n]. Thereby, the subscript m denotes the number of the sub-band (m=1, 2, . . . , M). Analogously, a discrete full-band transfer function G(z) may be decomposed into a number of sub-band transfer functions $G_m(z)$.

Figure 2:
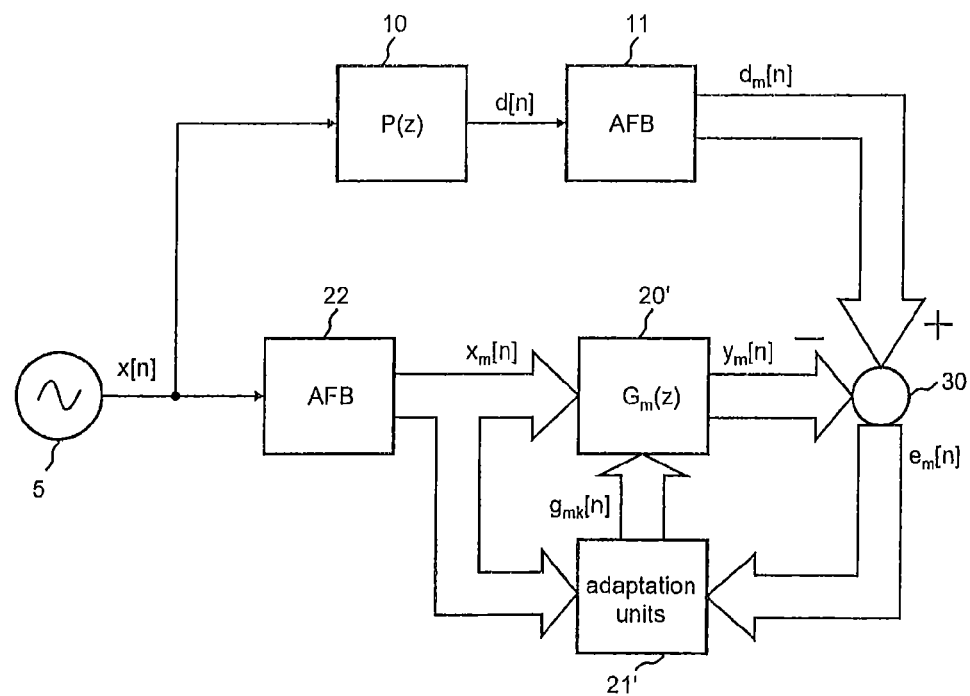
FIG. 2 illustrates another example of an adaptive signal processing module having a different modified structure, whereby the full-band FIR filter G(z) of FIG. 1 is replaced by a set of sub-band FIR filters $G_m(z)$.

FIG. 2 illustrates another example adaptive signal processing module structure, whereby the adaptive FIR filter 20 of FIG. 1 is replaced by a set 20' of sub-band FIR filters. In other examples, an IIR filter may be replaced with sub-band FIR filters. For this purpose, the full-band input signal x[n] is divided into a number M of sub-band input signals $x_m[n]$ (with m=1, 2, . . . , M) by using a first AFB 22. Analogously, the full-band desired signal d[n] may be split into a number M of sub-band signals $d_m[n]$ using a second AFB 11 (again m=1, 2, . . . , M). Each sub-band FIR filter may realize a narrow-band transfer function $G_m(z)$, where the subscript m denotes the number of the sub-band. Each sub-band filter $G_m(z)$ may also be represented by its filter coefficients $g_{mk}$, whereby k again denotes the index of the filter coefficients ranging from k=0 to k=$K_m$−1 ($K_m$ being the filter length of the filter $G_m(z)$ in the $m^{th}$ sub-band). Each FIR filter $G_m(z)$ is associated with an adaptation unit (the set of adaptation units is denoted by numeral 21' in FIG. 2), which receives the corresponding error signal $e_m[n]$=−$y_m[n]$ and calculates a respective set of updated filter coefficients $g_{mk}$ (k=1, 2, . . . , $K_m$−1) for the respective sub-band m.

The filter coefficients $g_{mk}$ of each one of the M sub-band FIR filters $G_m(z)$ 21' are adapted such that, after convergence of the adaptation algorithm, the overall transfer characteristic resulting from a combination of all sub-band transfer functions $G_m(z)$ substantially matches, or provides a close approximation to the predefined target function P(z).

Figure 3:
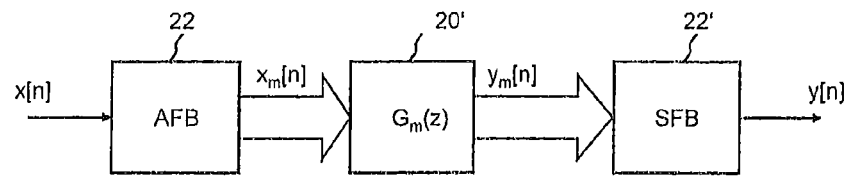
FIG. 3 illustrates the an example signal processing module structure having a set of sub-band FIR filters $G_m(z)$ which can replace a full-band FIR filter G(z)

After calculation of appropriate filter coefficients $g_{mk}$, the set 20' of FIR filters $G_m(z)$ 21' may be operated between an analysis filter bank (first AFB 22) and a corresponding synthesis filter bank (SFB 22') as illustrated in the example of FIG. 3 for filtering audio signals. In this case, the first AFB 22, the FIR filter bank 20', and the SFB 22' may together implement the transfer function G(Z) that approximately matches a target function P(z), which may represent, for example, an equalizing filter in an audio system. As in modern audio systems, not only the magnitude but also the phase may be subjected to equalization in order to generate a desired sound impression for a listener. Hence, the target function P(z) can generally represent a non-minimum phase filter with a non linear phase characteristic.

Whether the signal processing module structure of FIG. 3 that includes an analysis filter bank, a set of sub-band filters, and a synthesis filter bank is more efficient (in terms of computational effort and memory requirements) than an "ordinary" FIR filter with the same transfer function, can depend inter alia on the availability of efficient implementations of the analysis and synthesis filter banks. In order to account for the non-uniform frequency resolution of the human auditory system, a filter bank in which the bandwidths of the sub-bands with low center frequencies are narrower than the bandwidths of sub-bands with higher center frequencies may be used. Several approaches may be used to realize such a psycho-acoustically motivated division of full-band signals into a set of sub-band signals whose bandwidths depend on the position of the respective sub-band within the audible frequency range. However, no efficient filter bank is known that allows non-uniform division of an input spectrum into a set of sub-bands of different bandwidths. Nevertheless, other methods can allow for division of full-band signals into a set of sub-band signals of equal bandwidth. One example is the fast implementation of oversampled generalized discrete Fourier transform (GDFT) filter banks as described by S. Weiss et al (see S. Weiss, R. W. Stewart, "*Fast Implementation of Oversampled Modulated Filter Banks*", in: *IEEE Electronics Letters*, vol. 36, pp. 1502-1503, 2000), which makes use of a single prototype filter and the FFT algorithm, which is available in almost every signal processing environment.

In general, filter banks can be used that operate with sub-bands of equal bandwidths, since efficient implementations are not available for handling sub-bands of non-uniform bandwidth. To alleviate the insufficiency of equally wide sub-bands, however, different filter lengths of the FIR filters assigned to respective sub-bands may to be chosen. That is, FIR filters may include fewer filter coefficients in sub-bands where low frequency resolution is required than in sub-bands where a high frequency resolution is required. The latter sub-bands may usually be those which lie in the lower part of the audible frequency range. Thus a frequency resolution that corresponds to the frequency resolution of the human auditory system may be achieved by using efficient filter banks operating with equally wide sub-bands.

Figure 4:
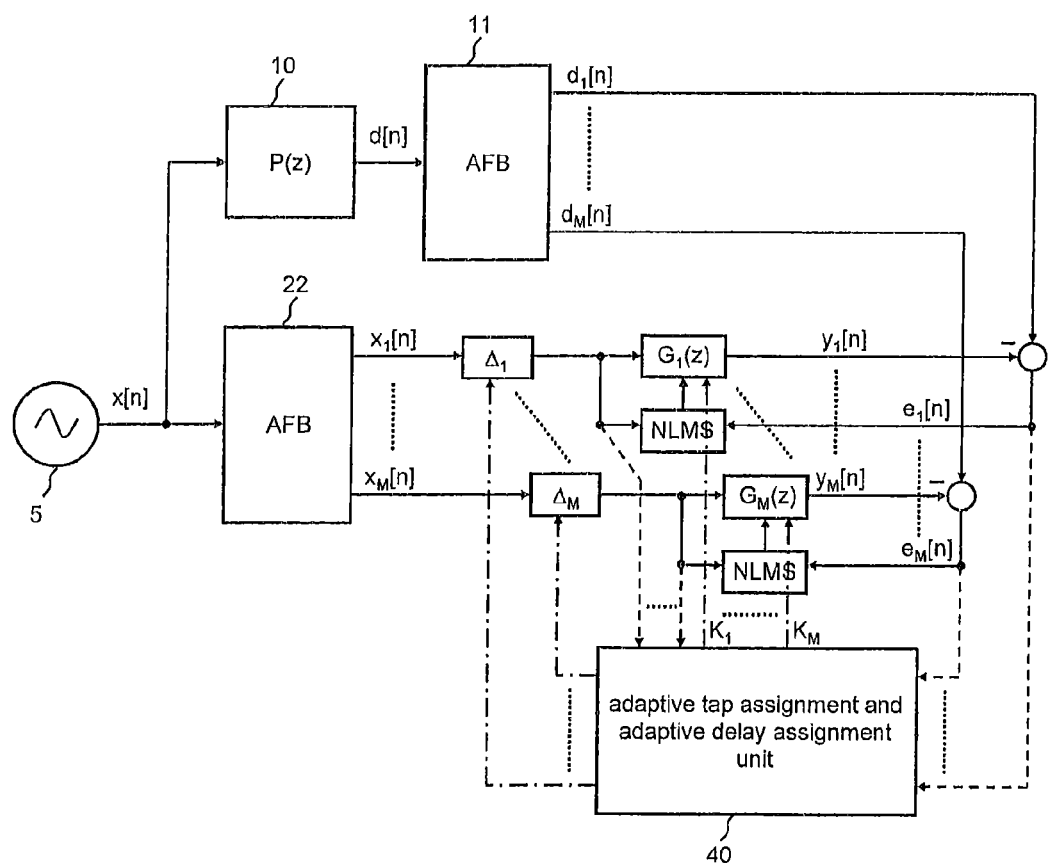
FIG. 4 illustrates a signal processing module structure for an adaptive FIR filter design including a number of sub-bands each comprising a sub-band FIR filter and a delay line.

As mentioned above, the target function $P(z)$ is generally a non-minimum phase filter which has a non-linear group-delay characteristic over frequency. In order to compensate for different signal propagation delays resulting from different group delays in different sub-bands, a delay line may be connected to each sub-band FIR filter upstream or downstream thereof. Thus, delay equalization using additional FIR filter coefficients and any related computational efficiencies may be avoided. Since the delay values, as well as the number of filter coefficients, depend on the target transfer function $P(z)$ (i.e. magnitude and phase response) to be realized, the number of filter coefficients (i.e. number of filter "taps") and the delay values may be adaptively determined for each sub-band as described herein below using "Adaptive Tap Assignment" and "Adaptive Delay Assignment" algorithms. Consequently, not only the filter coefficients (see coefficients $g_{mk}$ in FIG. 1) but also the number $K_M$ of coefficients and an additional delay $\Delta_n$, may be adaptively determined when designing the M sub-band FIR filters $G_m(z)$. FIG. 4 illustrates an example signal processing module structure that may be used for the sub-band FIR filter design. The example of FIG. 4 may be considered as an enhanced version of the module structure of FIG. 2 that includes additional delays in each sub-band signal path and an adaptation unit 40 illustrated as a global "adaptive tap assignment and delay assignment unit."

A full-band input signal x[n] (e.g. band-limited white noise) may be supplied by the signal generator 5 to the system 10 having the target transfer function $P(z)$, thus generating the desired signal d[n]. The desired signal d[n], as well as the input signal x[n], may be divided into a number M of sub-band signals $d_m[n]$ and $x_m[n]$, respectively. For purposes of clarity and brevity, the example of FIG. 4 illustrates only the components and signals associated with the first and the last sub-band (m=1 and m=M). The sub-band input signals $x_m[n]$ may be supplied to the adaptive FIR filters with transfer function $G_m(z)$, thus generating filtered sub-band signals $y_{rm}[n]$. Each filtered sub-band signals $y_m[n]$ may be subtracted from the corresponding desired signal $d_m[n]$, yielding an error signal $e_m[n]$ for each sub-band. The adaptation unit 40 is assigned to each FIR filter $G_m(z)$ for optimizing the filter coefficients $g_{mk}$ (i.e. the impulse response $\{g_{m0}, g_{m1}, g_{m(K-1)}\}$ of the filter) of the respective FIR filter $G_m(z)$, whereby the optimum set of filter coefficients $g_{mk}$ minimizes a norm (e.g. the power) of the respective error signal $e_m[n]$.

A delay line providing a delay $\Delta_m$ is connected upstream or downstream to each sub-band FIR filter $G_m(z)$. Further, an "adaptive tap assignment and adaptive delay assignment unit" (adaption unit 40) is provided which is configured to dynamically adapt the filter lengths $K_m$ of the FIR filters $G_m(k)$, as well as the corresponding delay values of the delay lines $\Delta_n$, in accordance with an adaptive tap assignment and adaptive delay assignment algorithm.

Different approaches may be considered for the adaptive tap assignment (i.e. the adaptation of FIR filter lengths). One example approach is to vary the filter lengths $K_m$ of the sub-band FIR filters $G_m(z)$ until the total error signal e[n] (whereby $e[n]=e_1[n]+e_2[n]+\ldots+e_M[n]$) reaches a minimum. In practice this technique can yield good results but can be quite time-consuming since, after each change in the number of filter coefficients, the adaptive filters may need time to converge again. Another example approach which can yield relatively good results while being relatively less time consuming can consider the energy of an S endmost filter coefficients $g_{m(Km-1)}, g_{m(Km-2)}, \ldots, g_{m(Km-S)}$. The S endmost filter coefficient is the last filter coefficient, or tap that forms part of the length of each of the sub-band filters $G_m(z)$. The filter length $K_m$ of a sub-band filter $G_m(z)$ can be varied until the energies of the mentioned S endmost filter coefficients are approximately equal. In this approach, the impulse response of the sub-band filter may decay exponentially over time, which should be the case in most systems. Comparing the energies of the S endmost filter taps of each sub-band filter may allow an assessment of how well the sub-band filters $G_m(z)$ approximate the target function $P(z)$. In addition, the comparison can provide a guideline for re-distributing filter coefficients across the sub-band filters so as to achieve sub-band filter impulse responses whose signal decay behavior resembles the signal decay behavior of the impulse response of the target function $P(z)$. In some examples, this can be regarded as optimum with respect to minimized errors.

Examples of the adaptive tap assignment algorithms are described in greater detail below. For real-valued full-band input signals x[n] (see FIG. 2), only a predetermined number of sub bands, such as M/2 sub-bands, may have to be processed since the other sub-band signals can be conjugate complex copies of the signals in the processed predetermined number of sub-bands. Thus, for example, the respective sub-band FIR filter transfer functions may comply with the relationship:

$$G_m(z)=G_{M-m+1}(z)^*, \text{ for } m=1, \ldots M/2, \quad (1)$$

whereby the asterisk denotes the complex conjugate operator, and M/2 represents an example of a predetermined number of sub bands that are processed. As used herein, it should be understood that M/2 is an example of a predetermined number of sub bands that are processed. In other examples, other predetermined numbers of sub bands may be processed where the remainder of the sub bands may be conjugate complex copies.

Accordingly, in this example, the filter lengths $K_m$ of the sub-band filters $G_m(z)$ (whereby m=1, 2, . . . , M/2) may be modified with a period of Q samples (i.e. samples in the sub-bad systems). The total number of filter coefficients $g_{mk}[n]$ of all sub-band filters $G_m(z)$, however, can remain constant. That is, if the filter length of one or more sub-band filters increases, the filter length of another sub-band filter may be reduced so as to keep the total number of filter coefficients constant. Accordingly, with a period of Q samples, the length of each of the predetermined number of processed sub-band FIR filters, such as M/2, is reduced by $\Delta K$ coefficients. Consequently there are $\Delta K \cdot M/2$ "free" coefficients, for example, which are re-distributed throughout the M sub-band filters according to certain criteria further described below.

The above "re-distribution" may be expressed by the following example equation $$K_m\left[\frac{n}{Q}+1\right] = K_m\left[\frac{n}{Q}\right] - \Delta K + \Delta K \cdot \frac{M}{2} \cdot \frac{c_m\left[\frac{n}{Q}\right]}{\sum_{i=1}^{M/2} c_i\left[\frac{n}{Q}\right]}, \quad (2)$$

whereby $m=1, 2, \ldots, M/2$ denotes the number of the sub-band. The expression $c_m[n/Q]$ represents the above-mentioned criterion for the distribution of filter taps (i.e. filter coefficients). As mentioned above, one useful criterion is the energy of the sub-band error signal $e_m[n]$. In this case $c_m[n/Q]$ can be expressed as:

$$c_m\left[\frac{n}{Q}\right] = \frac{1}{R}\sum_{r=0}^{R-1} e_m[n-r] \cdot e_m^*[n-r], \quad (3)$$

whereby $m=1, 2, \ldots, M/2$ and R is the number of samples over which the error signal is averaged. However, the adaptive sub-band FIR filter has to converge before eqn. (3) is evaluated and, consequently, R should be much smaller than Q (i.e. R<<Q). Another criterion considers the energy of the endmost S filter coefficients of the respective sub-band FIR filter. In this case $c_m[n/Q]$ can be expressed as:

$$c_m\left[\frac{n}{Q}\right] = \frac{1}{S}\sum_{s=0}^{S-1} g_{m(K_m-s)}[n] \cdot g_{m(K_m-s)}^*[n], \quad (4)$$

whereby $m=1, 2, \ldots, M/2$, and $K_m$ is the current filter lengths $K_m[n]$ in the respective sub-band. Alternatively, the energy of the sub-band input signals $x_m[n]$ may be considered together with the endmost S filter coefficients (see eqn. 5). In this case $c_m[n/Q]$ can be expressed as $$c_m\left[\frac{n}{Q}\right] = \frac{1}{R}\sum_{r=0}^{R-1} x_m[n-r] \cdot x_m^*[n-r] + \frac{1}{S}\sum_{s=0}^{S-1} g_{m(K_m-s)}[n] \cdot g_{m(K_m-s)}^*[n]. \quad (5)$$

The criterion according to eqn. (3) can yield the best results but can be time-consuming to evaluate. The criterion according to eqn. (5) can be used when the target system is time-varying and the input signals are arbitrarily colored, as may be the case in AEC (acoustic echo canceling) systems. In the case of a sub-band FIR filter design, where the input signal x[n] may be chosen by the designer to be white noise, eqn. (4) can yield relatively good quality results and simultaneously allow for a relatively fast adaptation.

In order to account for psycho-acoustic aspects the expression $c_m$ as defined in eqn. (3), (4), or (5) may be weighted with a corresponding weighting factor $w_m$, i.e. the expression $c_m[n/Q]$ is replaced by $w_m \cdot c_m[n/Q]$ in eqn. (3), (4), or (5). The weighting factors $w_m$ can be chosen such that the frequency resolution of the human auditory system is considered. Using the Bark scale the factors $w_m$ can be calculated as follows $$w_m = 13\tan^{-1}\left(0.76\frac{f_{c,m}+1}{1000}\right) + 3.5\tan^{-1}\left(\left(\frac{f_{c,m}+1}{7500}\right)^2\right) - \quad (6)$$

Figure 5:
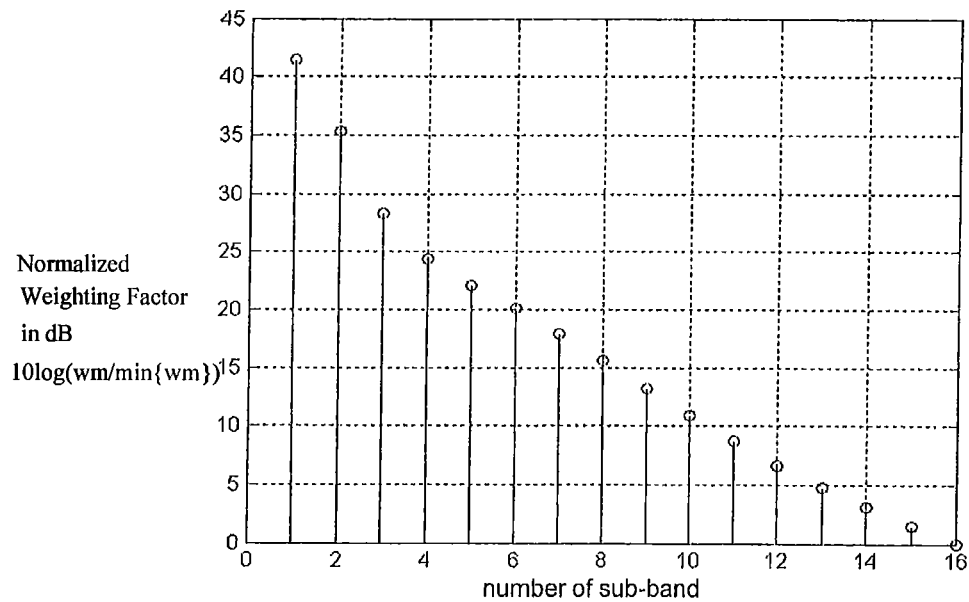
FIG. 5 illustrates example weighting factors based on a Bark scale for emphasizing the low frequency sub-bands when adapting the lengths of the sub-band FIR filters.

-continued
$$13\tan^{-1}\left(0.76\frac{f_{c,m}}{1000}\right) - 3.5\tan^{-1}\left(\left(\frac{f_{c,m}}{7500}\right)^2\right),$$

where $f_{c,m}$ denotes the center frequency (in Hz) of the $m^{th}$ sub-band which may be calculated as $f_{c,m}=(2m-1)\cdot f_S/(2\cdot M)$, where $f_S$ is the sampling frequency in Hz. An example set of normalized weighting factors $w_m$ which may be calculated in accordance with eqn. (6) are illustrated in FIG. 5, whereby a number of 16 sub-bands were considered as the predetermined number of processed sub bands (M/2=16).

The re-distribution of coefficients in accordance to eq. (2) may "equalize" either the energy of the sub-band error signals $e_m[n]$ (cf. eq. (3)) or the energy of a part (such as the endmost S filter coefficients) of the sub-band filter-coefficients $g_{mk}$ (where $k=\{K_m-S, \ldots, K_m-1\}$, cf. eq. (4)) or a combination of energies of the sub-band filter-coefficients $g_{mk}$ and the sub-band input signals $x_m[n]$ (cf. eq. (5)). Different energy-based criteria are possible. The "goal" of the algorithm is thus an equal distribution of signal energies across the sub-bands. As this goal is the desired outcome of an optimization process, the above described algorithm can also be seen as a minimization (or maximization) task.

In an ideal case the above mentioned criteria $c_m[n/Q]$ (see eqn. (3) to (5)) have equal values in each sub-band m whereby:

$$\frac{1}{M/2} = \frac{c_m\left[\frac{n}{Q}\right]}{\sum_{i=1}^{M/2} c_i\left[\frac{n}{Q}\right]}, \quad (7)$$

That is, in each one of the M/2 considered sub-bands the criterion $c_m[n]$ is a factor, such as 2/M, smaller than the total value of $c_m[n]$ summed over all sub-bands. Returning to the above-mentioned minimization task, the quality function to be minimized can written as:

$$q_m = \left|\frac{c_m\left[\frac{n}{Q}\right]}{\sum_{i=1}^{M/2} c_i\left[\frac{n}{Q}\right]} - \frac{2}{M}\right|. \quad (8)$$

As mentioned above, the FIR filters $G_m(z)$ generally have different group delays in different sub-bands resulting in different signal propagations delays. In order to compensate for such differing delays each FIR filter may be connected to an adjustable delay line upstream or downstream of the respective filter in each sub-band. The delay values in the sub-bands can be iteratively optimized as described below as "adaptive delay assignment".

The FIR filter coefficients which are adaptively assigned to the FIR filters in the sub-bands as explained above as "adaptive tap assignment" can be considered infinite impulse responses truncated by multiplication with a rectangular window function yielding a respective finite impulse response. For each sub-band FIR filter, this rectangular window function may be shifted (along the time axis), whereby the respective time-shift represents the effective delay of the delay line connected to the corresponding FIR filter.

An adaptive delay assignment algorithm may be targeted to find, for each sub-band, a delay value (such as a time-shift of the rectangular window mentioned above) that results in a maximum energy finite impulse response of the respective FIR filter. That is, when assigning the delay values to the respective delay lines only the energy or the corresponding FIR filter coefficients may be considered. However, this is not necessarily the only approach. As an alternative, the delay values may be chosen such that a norm of the total error signal $e[n]=e_1[n]+e_2[n]+ \ldots +e_{M/2}[n]$ is minimized. As already mentioned with regard to the adaptive tap assignment algorithm, the use of such a criterion will result in a slow convergence, while yielding sufficiently good results. Alternatively, the delay values may be chosen such that the total energy of the respective FIR filter coefficients is at a maximum.

However, as the FIR impulse responses (i.e. the FIR filter coefficients) of the sub-band filters generally include causal and acausal components due to the conversion into sub-bands, other criteria for finding optimum delay values may be targeted to equalize the energy of the causal and the acausal part of the respective impulse response. For example, the difference between the energy of the first half and the energy of the second half of the respective sub-band FIR impulse response is to be minimized. Such an optimizing strategy may be summarized as follows:

For each sub-band m, may define a first part and a second part of the respective sub-band FIR impulse response $g_{mk}$ and calculate the energy of the first part and the second part of the FIR impulse response. The following may be repeated with a period of V samples:

(A) If the energy of the first part of the FIR impulse response $g_{mk}$ is greater than the energy of the second part of the impulse response, then increase the delay of the respective delay line $\Delta_m$ by P taps (e.g. P=1).

(B) If the energy of the first part of the FIR impulse response $g_{mk}$ is lower than the energy of the second part of the impulse response, then the delay of the respective delay line $\Delta_m$ may be decreased by P taps (e.g. P=1). The minimum delay, however, can be zero.

(C) If both energies are equal, the delay may be left unchanged.

One might be tempted to divide the FIR impulse response into two parts of equal length. However, this would only yield good results for impulse responses whose maximum is located approximately in the middle of the impulse response. Considering a causal impulse response having its maximum at the left side, the above optimizing strategy would time shift the above-mentioned rectangular window to the right until the energy is equally distributed, thus inserting zeros on the left side of the impulse response, which is clearly undesirable. Therefore, better results are achieved in practice if the above mentioned first and second parts of the FIR impulse responses do not cover the entire length of the respective impulse response but only the upper and the lower margin thereof, defined by a variable U, whereby 0<U<1. To give an example, if U=0.6 then only 60 percent of the filter coefficients are considered when calculating the energy, whereby the lower 30 percent form the above-mentioned first part and the upper 30 percent the corresponding second part. Thus, in the $m^{th}$ sub-band the energies $E_{mL}$ and $E_{mU}$ of the first part and the second part, respectively, are $$E_{mU}[n] = \sum_{u=0}^{\lceil KmU/2 \rceil} g_{m(Km-u)}[n] \cdot g^*_{m(Km-u)}[n], \quad (9)$$

$$E_{mL}[n] = \sum_{u=\lfloor(1-U/2)Km\rfloor}^{Km} g_{m(Km-u)}[n] \cdot g^*_{m(Km-u)}[n]. \quad (10)$$

Thus, the delay value $\Delta_m$ is increased if $E_{mU}<E_{mL}$, decreased if $E_{mU}>E_{mL}$, and left unchanged if $E_{mU}=E_{mL}$, or expressed in mathematical terms $$\Delta_m[n/V] = \begin{cases} \Delta_m[n/V-1] + P & \text{if } E_{mU} < E_{mL} \\ \max\{\Delta_m[n/V-1] - P, 0\} & \text{if } E_{mU} > E_{mL} \\ \Delta_m[n/V-1] & \text{if } E_{mU} = E_{mL}. \end{cases} \quad (11)$$

Generally the adaptive delay assignment algorithm can also be seen as a minimization task whereby, in each sub-band, the respective delay value $\Delta_m$ is varied until the quality criterion $c'_m[n/V]=|E_{mU}-E_{mL}|$ reaches a minimum, whereby the index n/V indicates that the criterion is only evaluated every $V^{th}$ sample time.

One should note that, when adjusting (e.g. increasing) the delay value $\Delta_m$ of a delay line in one sub-band by a number of taps, the corresponding filter impulse response (FIR filter coefficients) may be shifted to the left, thus keeping the total delay (including the delays of delay line and FIR filter) constant. This avoids the need for a long re-adaptation of the FIR filter coefficients due to the variation of the delay value $\Delta_m$. However, the adaptation period with which the adaptive delay assignment as well as the adaptive tap assignment is performed can be considerable longer than the adaptation step width of the LMS/NLMS algorithm, so that the adaptation of the FIR filter coefficients $g_{mk}$ may be in a steady state when the adaptive tap assignment and adaptive delay assignment are initiated.

Although the adaptive adjustment of filter lengths as well as the adaptive adjustment of additional delays in each sub-band can be usefully combined, each adaptation method (adaptive tap assignment and adaptive delay assignment) may be used on its own, independently from each other. For example, the number of filter coefficients may be pre-defined for each sub-band (e.g. in accordance with the Bark scale) and the delays $\Delta_m$ may be adaptively adjusted as explained above. Further, the adaptive determination of the filter lengths may be performed in accordance with the adaptive tap assignment method explained above without separate delay units or with fixed and predefined delays. This may be especially appropriate in cases where the desired target function P(z) is a linear phase or a minimum phase transfer function.

Having discussed a filter design method for designing efficient sub-band FIR filter structures, examples for efficiently implementing such sub-band FIR filter structures are explained in greater detail. Firstly, the analysis and synthesis filter banks are discussed in greater detail. Efficient signal processing module structures for implementing the sub-band filters, such as FIR filters, are then discussed with reference to the examples of FIGS. 7 and 8.

As already mentioned above, the analysis filter bank and the corresponding synthesis filter banks (such as the filter banks 22 and 22' in FIG. 3) divide the real-valued full-band input signal x[n] into a set of complex-valued sub-band signals $x_m[n]$ and re-combine the complex-valued filtered sub-band signals $y_m[n]$ into a real-valued output signal y[n]. However, other filter banks can be used that only operate with real-valued sub-band signals. In this case the sub-band FIR filters may be implemented more efficiently. However, the real-valued filter banks may require twice as many MACs (multiply-accumulate operations) as the corresponding complex-valued filter banks. Further, the sub-bands may be under-sampled by a factor M when using complex sub-band signals whereas, in contrast, the maximum under-sampling factor can be only M/2 when using real-valued filter banks. Finally, the required filter lengths of the sub-band FIR filters are only half of those required when using real-valued sub-band signals. This indicates that the use of complex-valued AFBs and SFBs requires less computational effort than real-valued filter banks. However, both types of filter banks are applicable for use.

Figure 6:
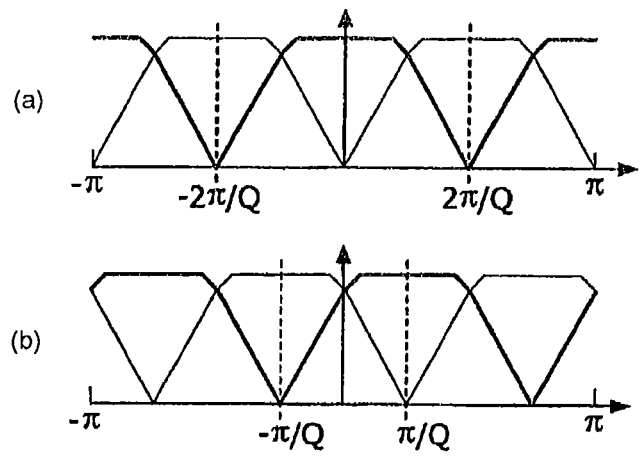
FIG. 6 schematically illustrates an example of the magnitude response of an evenly stacked and an oddly stacked filter bank.

Complex-valued filter banks can be evenly or oddly stacked filter banks. Both types may be efficiently implemented by means of the generalized discrete Fourier transform algorithm (GDFT algorithm). FIG. 6 illustrates the sub-bands of an evenly stacked (FIG. 6*a*), as well as an oddly stacked (FIG. 6*b*) filter bank. The use of an oddly stacked GDFT filter bank seems to be preferable, as half of the M sub-bands are complex conjugate copies of the other half of the M sub-bands and consequently only a number, such as M/2, complex-valued sub-band signals may be processed. When using an evenly stacked GDFT filter bank the lowest and the highest sub-bands are real-valued but only have half the bandwidths of the other middle frequency sub-bands. Consequently, a number of sub-band signals, such as M/2+1 sub-band signals may be processed, whereby the signals in the lowest sub-band are real-valued. As a result, the memory requirements are only half and the required MACs only a quarter in the lowest frequency sub-band as compared to a complex-valued middle frequency sub-band. Considering the fact that the FIR filter ($G_1(z)$) of the lowest frequency sub-band may have the most filter coefficients $g_{1k}$ (when compared with a frequency resolution, such as a frequency resolution according to Bark or any other psycho-acoustically adapted frequency scale) the overall efficiency improves by about 25 percent in terms of memory required and by about 50 percent in terms of MACs required, although the total number of sub-bands to be processed increases from M/2 to M/2+1.

Figure 7A:
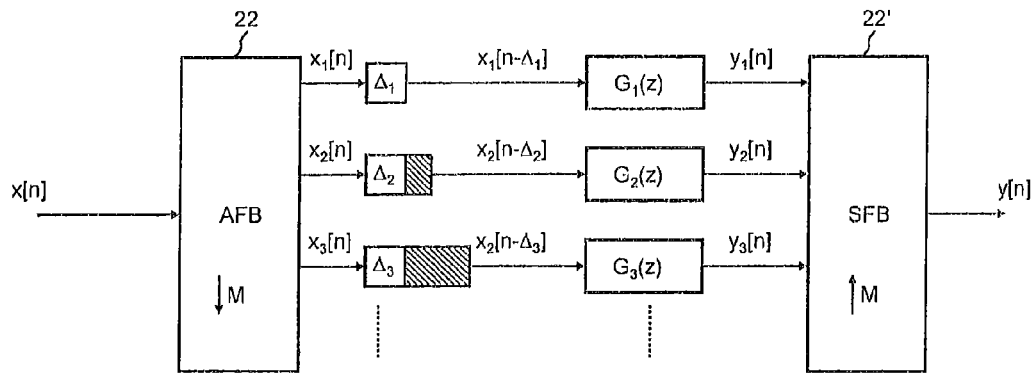
FIG. 7a schematically illustrates an example of the structure of a digital filter module divided in a plurality of sub-band filters.

In the following the implementation of a (desired) digital FIR filter which has been decomposed into a plurality of sub-band filters $G_m(z)$ and respective delays $\Delta_m$ are discussed using the application in an audio system as an illustrative example. The example digital filter module structure as illustrated in FIG. 7*a* may be implemented for each audio channel. That is, an analysis filter bank 22 and a corresponding synthesis filter bank 22' may be provided for each audio channel. In this context the term "audio channel" refers to the output channels provided by the amplifier and not to the number of input signals (Note, that an amplifier may have only two input channels (stereo input) but, for example, six output channels for 5.1 surround sound output). The digital FIR filter may be designed in accordance with the filter design method discussed above. However, any FIR filter may be implemented using the filter structure and the method discussed herein. Each of the M sub-band signals $x_m[n]$ provided by the analysis filter bank 22 (m=1, 2, 3, . . . , M) is separately filtered (by applying the corresponding sub-band filter $G_m(z)$) and delayed (by applying a corresponding delay $\Delta_m$). As discussed above, the filter lengths of the FIR filters $G_m(z)$ are set so as to take into account the frequency characteristics of the human auditory system, whereas the bandwidths of the individual sub-bands are substantially equal, as the filter banks can only be realized in a computationally efficient manner if equally wide sub-bands are used. Respective delays $\Delta_m$ are applied to each sub-band to reduce the required filter taps of the FIR filters $G_m(z)$. Generally, the filter lengths and the delays can be arbitrarily set and may be adjusted in accordance with the adaptive tap assignment and the adaptive delay assignment methods as discussed above. Except for at least the delays, the filter module structure of FIG. 7*a* may be considered as generally corresponding in many respects to the basic module structure already discussed with reference to FIG. 3.

As already explained with reference to FIG. 6, the application of evenly-stacked GDFT filter banks is particularly desirable when using sub-band filter lengths that correspond to the frequency resolution of the human ear. That is, the FIR filter applied to the lowest frequency sub-band has to have the highest frequency resolution and thus the highest number of filter coefficients. When using evenly-stacked GDFT filter banks this lowest frequency sub-band is real-valued and thus the memory requirements are reduced, such as by a quarter and the required computation time is reduced, such as halved as compared to the alternative, in which oddly-stacked GDFT filter banks are used. Two or more audio channels may be provided with FIR filters implemented in sub-bands, so that this choice of the filter banks entails a significant improvement.

The memory requirements may be further reduced when considering the dependencies between the number of sub-bands and the required memory. On the one hand, an increasing number of sub-bands entails decreasing bandwidths of the individual sub-bands. As a consequence, the prototype filter has to have a steeper pass-band/stop-band transition which necessarily results in a larger number of filter coefficients and thus the required amount of memory, particularly for implementing the delay lines, increases. On the other hand, a high number of sub-bands also entails a larger block size (used in the FFT algorithms), and, as a consequence, more computation time can be used for swapping internal memory to external memory, thus reducing the required internal memory. A compromise may be found when deciding the number of sub-bands. An example analysis shows that for audio applications good results can be achieved for M=16, M=32, and M=64 sub-bands, whereby an undersampling of N=M/2 is applied. That is, in this example, when using M=32 sub-bands, the sampling rate of the sub-band signals may be reduced by a factor of N=16 and thus the FFT block size also is set to 16. In the latter example (M=32), only 17 sub-bands (M/2+1) actually have to be processed, whereby the lowest frequency sub-band (as well as the highest frequency sub-band) may be real valued as discussed above. Accordingly, the remaining middle frequency sub-bands may be complex valued.

Figure 7B:
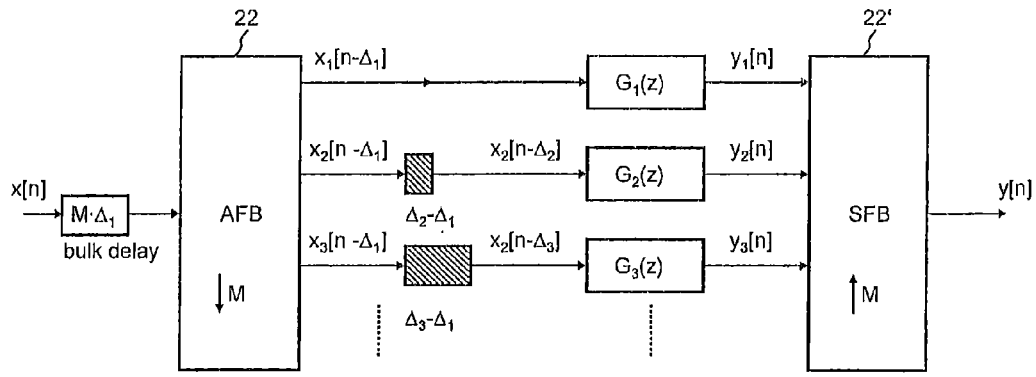
FIG. 7b schematically illustrates another example of the structure of a digital filter module divided in a plurality of sub-band filters.

It may also be desirable to swap out as much internal memory of a processor such as a digital signal processor (DSP) or digital audio processor, to cheaper external memory, without producing lengthy initializations which would consume a large amount of computational time. The memory required for implementing the sub-band delays $\Delta_m$ external memory or internal memory of the DSP. However, external memory could result in a large number of memory transfer initializations. For example, 17 sub-bands in 10 audio channels require about 170 memory transfer initializations (for reading and writing) per block which could require computational power of about 1020 mips when assuming 3 mips per initialization. In one example, the computational power directed to memory transfers can be reduced when rearranging the digital filter module structure illustrated in FIG. 7*a* by "moving" the shortest sub-band delay into the full-band (broad-band) domain of the full-band input signal x(n), as shown in FIG. 7*b*. In the example of FIG. 7*b* the shortest sub-band delay $\Delta_{MIN}$ may be equal to the first delay $\Delta_1$. The corresponding delay in the broad-band domain is denoted as "bulk-delay" and equals $\Delta_{BULK}=M \cdot \Delta_{MIN}$. The remaining sub-band delays may be reduced by $\Delta_{MIN}$ as illustrated in FIG. 7b.

Figure 8:
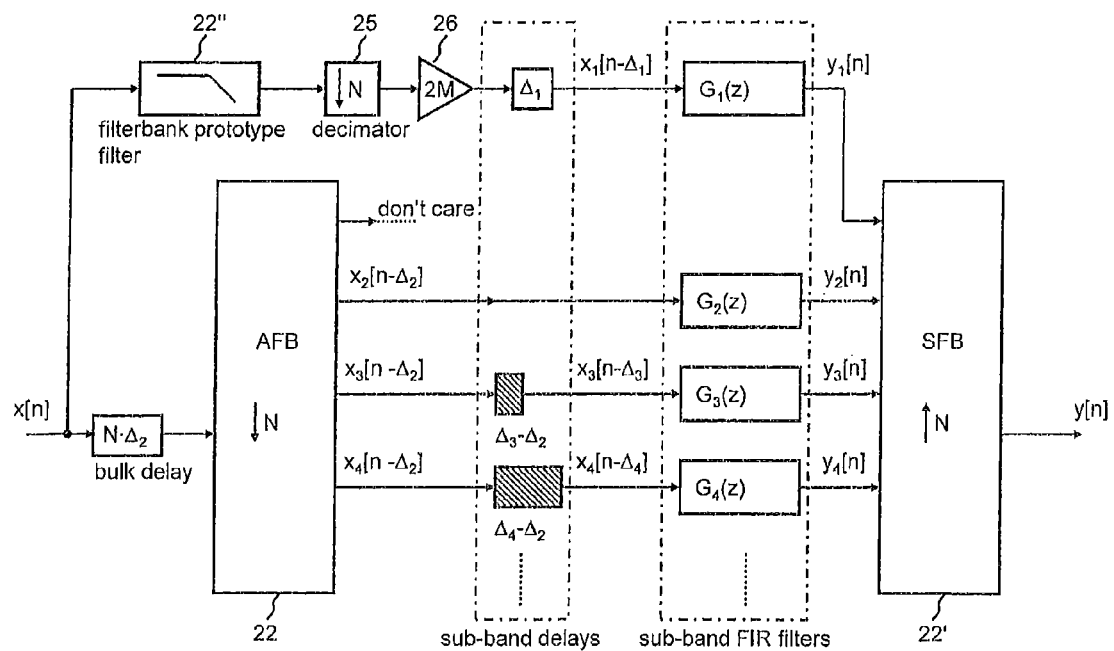
FIG. 8 illustrates an example of an alternative to the filter bank of FIG. 6 with reduced memory requirements.

The broad band bulk delay may be swapped out to external memory as only one transfer initialization (for read and for write access) instead of 17 initializations, as mentioned before. The remaining—but now shorter—sub-band delays can remain in the internal memory. However, in another example the solution illustrated in FIG. 7b may be further improved. As the FIR filter in the lowest sub-band has the longest impulse response (i.e. the highest number of filter taps) and thus the shortest delay, which is significantly shorter than the remaining delays, the required (internal) memory for the other sub-band delays is still high. This situation may be further improved when modifying the digital filter module structure of FIG. 7b by "extracting" the lowest sub-band from the sub-band filter structure and processing it separately as illustrated in FIG. 8. In other words, the lowest sub-band with the shortest sub-band delay may be processed along a first path that includes a first sub-band FIR filter that is separate from the sub-band FIR filters of the remaining sub-bands, which may be processed along a second path in a set of sub-band FIR filters.

In contrast to the example of FIG. 7b, the bulk delay $\Delta_{BULK}$ is not formed based on the shortest sub-band delay (which usually is the delay $\Delta_1$ of the lowest sub-band) but rather based on the second shortest delay, e.g. $\Delta_2$. As the differences between the delays $\Delta_3-\Delta_2$, $\Delta_4-\Delta_2$, $\Delta_5-\Delta_2$, etc. are much smaller than in the example of FIG. 7b, the achievable reduction of required memory is larger. Accordingly, the broad band input signal x[n] may be processed along the first path which bypasses the AFB 22 and may be instead filtered using an AFB filter bank prototype filter 22", then downsampled by a factor N (decimator 25) and multiplied by a factor, such as 2M (gain 26) and finally delayed by the original sub-band delay $\Delta_1$ and filtered with the corresponding (real-valued) sub-band FIR filter ($G_1(z)$) to obtained the output signal $y_1[n]$ of the first sub-band, which may be provided to the SFB 22'. The AFB filter bank prototype filter 22" may be a low pass filter, such as an FIR filter. The remaining sub-band output signals $y_2[n]$, $y_3[n]$, . . . , $y_{M/2+1}[n]$ may be obtained in a similar way as in the example of FIG. 7b along the second path, which uses the AFB 22. The size of the bulk delay $\Delta_{BULK}$, in FIG. 8 may be different, such as being larger than in the example of FIG. 7b, which can result in correspondingly shorter sub-band delays $\Delta_3-\Delta_2$, $\Delta_4-\Delta_2$, $\Delta_5-\Delta_2$, etc. thus further reducing the requirement for internal memory of the DSP. All the sub-band output signals $y_m[n]$ may be combined into the broad-band output signal y[n] using the SFB 22' similar to the previous examples.

Figure 9:
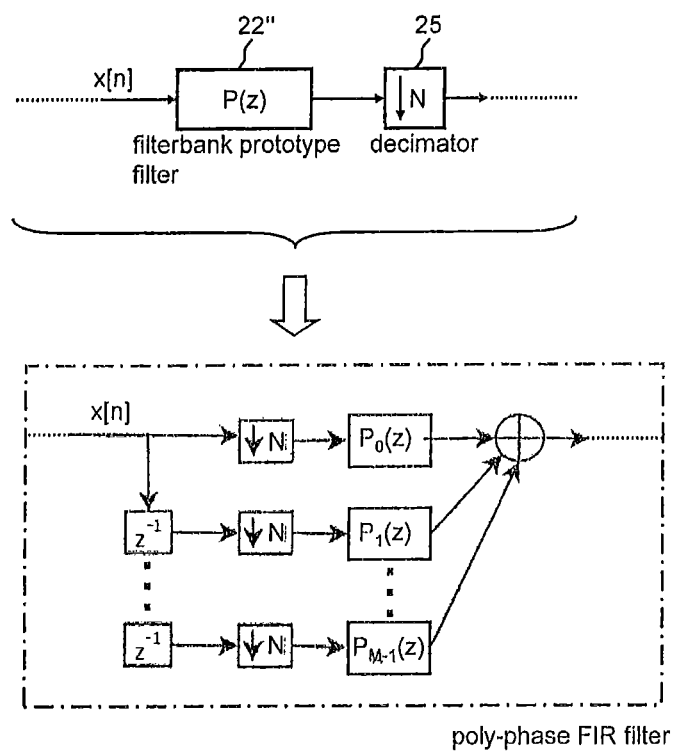
FIG. 9 illustrates an example of an option for improving the example of FIG. 8.

In order to reduce the computational effort for implementing the FIR filter 22' (i.e. the AFB prototype filter P(z)) and the subsequent downsampling, the FIR filter 22" and the decimator 25 may be replaced by a corresponding polyphase filter which is computationally more efficient (see FIG. 9). In the illustration of FIG. 9 the filter transfer functions $P_0(z)$, $P_1(z)$, etc. represent filters including the filter coefficients [$p_0$, $p_N$, $p_{2N}$, . . . ], [$p_1$, $p_{N+1}$, $p_{2N+1}$, . . . ], etc., whereby the coefficients $p_0$, $p_1$, $p_2$, etc. represent the filter coefficients of the AFB prototype filter P(z) 22".

Figure 10:
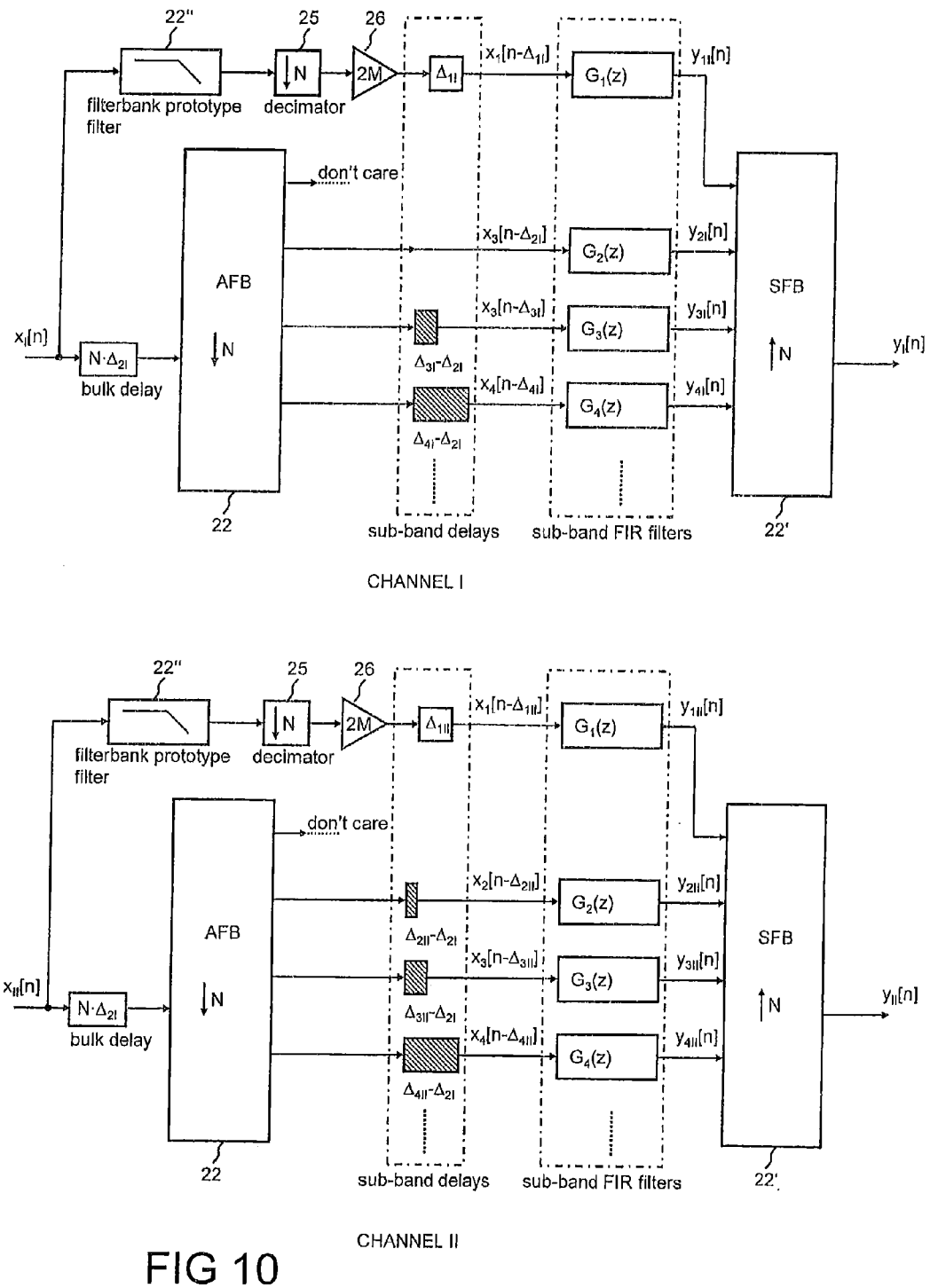
FIG. 10 illustrates an example including filters in two separate audio channels.

Using the examples of FIG. 8 or 9 allows a significant reduction of the memory transfer initializations, in the present example (17 sub-bands, 10 channels) from 340 initializations to 20 initializations. These may be further reduced to 2 by equalizing the bulk delays so that the bulk delays for all channels can be swapped out and swapped back all at once. This procedure is illustrated in FIG. 10.

Figure 11:
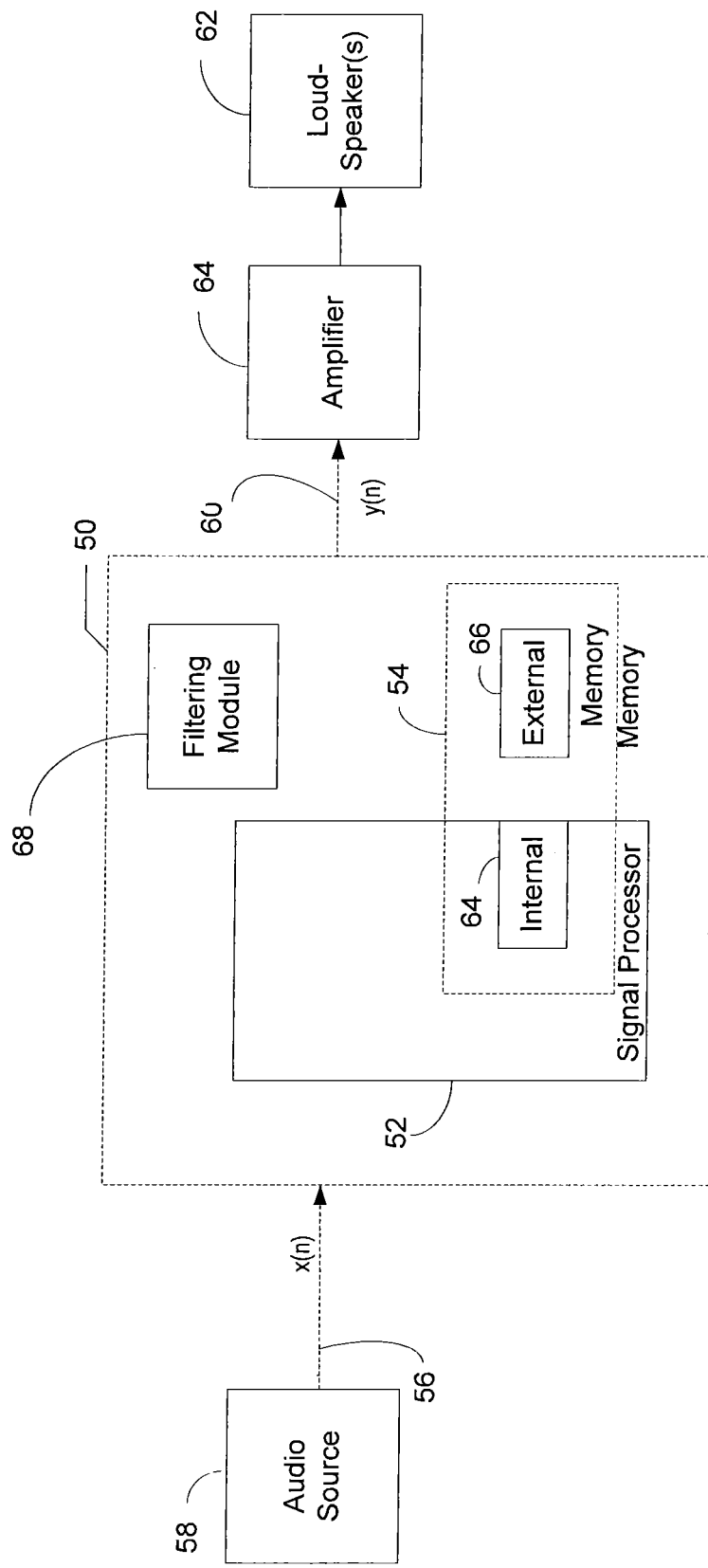
FIG. 11 is an example audio system.

FIG. 11 is a block diagram that includes an example audio signal processing system 50 that includes a signal processor 52 and memory 54. The example audio signal processing system 50 may include any number of audio input channels 56 that receive the input signal x[n], such as from one or more audio sources 58. In addition, the audio signal processing system 50 may include any number of audio output channels 60 that provide the output signal y[n]. The audio signal processing system 50 may supply output audio signals on the audio output channels 60, which may be used to drive a load, such as at least one loudspeaker 62. The audio signal processing system 50 may include or be coupled (directly or indirectly) to a power amplifier 64 that amplifies the audio output channels 60 prior to driving the load, such as the loudspeakers 62. For purposes of brevity, other parts that may be present in the audio signal processing system 50, such as a display, input/output ports, a user interface, and the like are omitted. In addition, FIG. 11 depicts only one of many possible implementations of the audio signal processing system 50 and includes a relatively simple example of signal flow path from the audio source 58 to a destination load, such as a loudspeaker 62, however, in other examples, any number of additional processing techniques, hardware devices and/or signal processes, which are not shown, may be included between the source and the destination.

The audio signal processing system 50 may be included in, or form at least part of any system capable of providing audio content such as an audio system, head phones, or a multimedia system in a vehicle. Examples of the audio source 58 include a compact disc player, a video disc player, a radio tuner, a navigation system, a mobile phone, a vehicle head unit, a wireless or wireline communication device, a personal computer, a multimedia memory storage device, such as an IPOD or MP3 player, a signal generator, or any other device capable of generating digital or analog audio signals representative of audio sound. In one example, the audio source 58 may provide digital audio input signals representative of left and right stereo audio input signals on left and right audio input channels. In other examples, the audio input signal may be one or more analog signals. Alternatively, or in addition, the audio input signals may be received as microphone input signals, received as streaming audio signals over a network, such as the Internet, or be generated as live sound audio signals. The audio signal may include any number of channels, such as a mono audio input channel, seven audio input channels in Logic 7™ surround sound, or six audio channels in Dolby 5.1™ surround sound.

The signal processor 52 may be any computing device capable of processing audio and/or video signals. The signal processor 52 may operate in association with the memory 54 to execute instructions stored in the memory 54. The instructions may provide at least part of the functionality of the audio signal processing system 50. The memory 54 may be any form of one or more data storage devices, such as volatile memory, non-volatile memory, electronic memory, magnetic memory, optical memory, or any other form of non-transitory data storage mechanism or system. The memory 54 may include internal memory 64 residing with the signal processor 52 and external memory 66 external to the signal processor. The memory 54 may store instructions and data. The data may be audio content, parameters used/updated during processing, parameters generated/updated during processing, user entered variables, and/or any other information related to processing audio signals.

The signal processor 52 may be a digital audio processor that includes one or more processing devices capable of performing logic to process the audio signals supplied on one or more audio channels from the audio source 58. Such processing devices may include digital signal processors (DSP), microprocessors, field programmable gate arrays (FPGA), or any other device(s) capable of executing instructions. In addition, the signal processor 52 may include other signal processing components such as filters, analog-to-digital converters (A/D), digital-to-analog (D/A) converters, signal amplifiers, decoders, delay, or any other audio processing mechanisms. The signal processing components may be hardware based, software based, or some combination thereof.

In one example, the signal processor 52 can be a digital signal processor (DSP) operating to execute the instructions stored in the memory 54 and modules included in, or associated with the audio signal processing system 50. In one example, the DSP may be used for sampling the input signal x[n] and performing audio signal related processing in the digital domain, which includes a signal processing module structure for adaptive calculation of filter coefficients and/or digital filtering using such filter coefficients. The signal processor 52 may also include, for example, a microprocessor that may perform logic based computations related to processing the audio signals. Audio signals received by the signal processor 52 on one or more input audio channels 56 may be converted to the digital domain (if not received in digital form) using an analog-to-digital converter (ADC). The analog-to-digital converter may be a separate device, or may be instructions executed by the signal processor 52.

Processing by the signal processor 52 may include equalization, audio signal modification, such as delay, phase adjustment, frequency based signal processing, routing or any other form of audio signal processing of the input signal x[n]. In addition or alternatively, the signal processor 52 may control the previously discussed sub-band filtering using filtering module 68 to calculate filter coefficients for sub-band filtering and/or apply at least one corresponding digital filter to the input signal x[n], as previously discussed. The term "module" may be defined to include one or more executable modules. The modules are defined to include software, hardware or some combination thereof executable by the signal processor 52. Software modules may include instructions stored in the memory 54, or other memory device, that are executable by the signal processor 54 or other processor. Hardware modules may include various devices, components, circuits, gates, circuit boards, and the like that are executable, directed, and/or controlled for performance by the signal processor 54.

The processed audio signals may be digital audio signals. The digital audio signals may be converted to analog audio signals by a digital-to-analog converter (DAC) and provided as digital processed audio signals (output signals y[n]), on the output audio channels 60 for use to, for example, drive the one or more loudspeakers 62. The digital-to-analog converter may be a separate device, or may be instructions executed by the signal processor 52. Alternatively, analog processed audio signals may be supplied from the signal processor 52 and the DAC may be omitted.

The amplifier 64 may be any form of signal amplification device, such as a class D audio amplifier. In one example, the amplifier may be a power integrated circuit. The one or more loudspeakers 62 may be any form of transducer device capable of translating electrical audio signals to audible sound. The loudspeaker 62 may be a group of loudspeakers 62 that are configured and located to operate individually or in groups, and may be in any frequency range. The one or more loudspeakers 62 may collectively or individually be driven by amplified output channels, or amplified audio channels, provided from the output signals y[n]. The loudspeakers 62 may consist of a heterogeneous collection of audio transducers that receives a number of separate audio channels, such as stereo, 5 channel, 6 channel or seven channel audio signals. Each transducer may receive an independent and possibly unique amplified output audio signal. Accordingly, the audio signal processing system 50 may operate to produce mono, stereo, or surround sound signals using any number of loudspeakers 62.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim:

1. An audio system with at least one audio output channel comprising:
    a digital audio processor in which at least one digital filter is implemented for each of a plurality of audio channels;
    the digital filter of each of the audio channels comprises:
        an analysis filter bank configured to receive an input audio signal and divide the input audio signal into a plurality of sub-bands as sub-band signals having equal bandwidths, a spectra of the sub-band signals constituting a spectrum to of the input audio signal;
        a sub-band filter for each sub-band, the sub-band filter for each sub-band configured to provide respective filtered sub-band signals; and
        a synthesis filter bank configured to receive and combine the filtered sub-band signals to provide a broad-band output audio signal;
    where a delay is associated with each of the respective sub-band signals, the delay of one of the sub-band signals being applied to the input audio signal before division by the analysis filter bank, and residual delays being applied to at least some of the sub-band signals divided by the analysis filter bank.

2. The system of claim 1 further comprising:
    a low-pass filter configured to receive the input audio signal and provide, a further sub-band signal, the further sub-band signal being a lowest-frequency sub-band of the input audio signal, which is not tapped at the analysis filter bank;
    a further sub-band filter configured to filter the lowest-frequency sub-band signal; and
    a further sub-band delay applied to the lowest-frequency sub-band signal upstream or downstream of the further sub-band filter,
    where the delay of one of the sub-band signals being applied to the input audio signal corresponds to a shortest delay associated with a respective sub-band tapped at the analysis filter bank.

3. The system of claim 1,
where a number of filter coefficients of the sub-band filters is set such that a frequency resolution of the sub-band filters at least approximately corresponds to a frequency resolution of a human auditory system.

4. The system of claim 1, where the audio channels comprise at least a first and a second audio channel,
where the input audio signal of each of the first and the second audio channels is delayed with the delay, the delay being equal to a shortest delay of all sub-band signals of the first and second audio channels tapped at the analysis filter bank.

5. The system of one of the claims 1:
where the analysis filter bank and the synthesis filter bank are evenly-stacked generalized discrete Fourier transform filter banks, which are configured to process the input audio signals in blocks, the sub-band signals being down-sampled as compared to the input audio signal by a factor corresponding to a block size of the blocks, and
where a lowest-frequency and a highest-frequency sub-band signal of the sub-band signals is real valued, where a plurality of middle frequency sub-band signals are complex valued.

6. The system of claim 2, where the low-pass filter corresponds to a prototype filter used by the analysis filter bank.

7. The system of claim 1, where audio signal is a broad band audio signal, and the sub-band filter is a sub-band finite impulse response (FIR) filter.

8. A method for filtering at least one audio signal provided in at least one audio output channel of an audio system; the method comprises:
receiving an input audio signal having a spectrum lying within a frequency band;
dividing the frequency band of the input audio signal into a plurality of sub-bands to provide sub-band signals, the spectra of the sub-band signals comprising the spectrum of the input audio signal;
filtering each of the sub-band signals using a respective filter for each sub-band;
combining the filtered sub-band signals to provide a broadband output audio signal;
associating a delay with each of the sub-bands;
applying the delay associated with one of the sub-bands to the input audio signal before dividing the frequency band; and
applying residual delays to sub-band signals of respective sub bands other than the one of the sub-bands.

9. The method of claim 8,
wherein dividing the frequency band comprises processing the input audio signal in blocks with a first evenly-stacked generalized discrete Fourier transform (GDTF) analysis filter bank;
wherein dividing the frequency band further comprises downsampling the sub-band signals as compared to the broad band signal by a factor corresponding to a block size of the blocks.

10. The method of claim 9, wherein combining the filtered sub-band signals comprises providing the broad-band output signal in blocks using a second evenly-stacked GDTF synthesis filter bank, which corresponds to the first evenly-stacked GDTF filter bank; and
wherein combining the filtered sub-band signals further comprises upsampling the sub-band signals as compared to the resulting broad-band signal by a factor corresponding to the block size.

11. The method of claim 8, further comprising:
low-pass filtering the input audio signal to provide a further sub-band signal of a lowest-frequency sub-band of the input audio signal;
filtering the lowest-frequency sub-band signal using a respective further sub-band filter; and
delaying the lowest-frequency sub-band signal with a further sub-band delay,
where the delay applied to the input audio signal corresponds to a shortest delay associated with the one of the sub-bands that is other than the lowest frequency sub-band.

12. The method of claim 8, where a number of filter coefficients of the sub-band filters is set such that a frequency resolution of the sub-band filters at least approximately corresponds to a frequency resolution of a human auditory system.

13. The method of claim 8,
where the at least one audio output channel of the audio system comprises at least a first and a second audio output channel, and
where the delay applied to each input audio signal is equal, and is a shortest delay of all sub-band signals of the first and second audio output channels obtained by dividing the frequency band.

14. The method of claim 11, wherein low-pass filtering further comprises the step of using a low pass filter that corresponds to a prototype filter used by a generalized discrete Fourier transform (GDFT) filter bank for the step of dividing the frequency band.

15. An audio system comprising:
a processor;
a filter module executed by the processor to receive and process an audio input signal,
the audio input signal divided into a plurality of sub-band signals by execution of the filter module with the processor;
each of the sub-band signals associated with a respective sub-band delay and a respective sub-band filter;
the filter module further executed by the processor to apply a first sub-band delay of a respective first sub-band signal to the audio input signal prior to division of the audio input signal into the sub-band signals;
the filter module executed by the processor to apply the respective associated sub-band delay to each of the plurality of sub-band signals except the first sub-band signal, to which the first sub-band delay is not applied; and
the filter module executed by the processor to filter each of the sub-band signals with the respective associated sub-band filter, and re-combine the filtered sub-band signals to form an audio output signal.

16. The audio system of claim 15, where the filter module includes an analysis filter bank configured to divide the audio input signal into the plurality of sub-band signals, and a corresponding synthesis filter bank configured to re-combine the filtered sub-band signals to form the audio output signal.

17. The audio system of claim 15, where the filter module is further executed by the processor to filter the audio input signal to obtain a second sub-band signal having an associated second sub-band delay, the associated second sub-band delay being shorter than the first sub-band delay, and the audio input signal being filtered to obtain the second sub-band delay prior to application of the first sub-band delay to the audio input signal.

18. The audio system of claim 17, where the audio input signal is filtered with a low pass filter to obtain the second sub-band signal.

19. The audio system of claim 17, where the filter module is executed by the processor to apply the second sub-band delay to the associated second sub-band signal along a first processing path that is a different path from a second processing path on which the first sub-band signal is processed.

20. The audio system of claim 19, where the filter module is executed with the processor to apply a second sub-band filter to the second sub-band signal along the first processing path, and include the filtered second sub-band signal with the re-combined filtered sub-band signals that form the audio output signal.

* * * * *